(12) United States Patent
Lee et al.

(10) Patent No.: US 11,024,675 B2
(45) Date of Patent: *Jun. 1, 2021

(54) ORGANIC PHOTOELECTRONIC DEVICE AND IMAGE SENSOR

(71) Applicant: Samsung Electronics Co., Ltd., Suwon-si (KR)

(72) Inventors: Gae Hwang Lee, Seongnam-si (KR); Sung Young Yun, Suwon-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/518,167

(22) Filed: Jul. 22, 2019

(65) Prior Publication Data

US 2019/0348468 A1     Nov. 14, 2019

Related U.S. Application Data

(62) Division of application No. 15/986,956, filed on May 23, 2018, now Pat. No. 10,374,016, which is a
(Continued)

(30) Foreign Application Priority Data

Jul. 3, 2015    (KR) .................. 10-2015-0095356

(51) Int. Cl.
    *H01L 27/30*       (2006.01)
    *H01L 51/42*       (2006.01)
              (Continued)

(52) U.S. Cl.
    CPC ........ *H01L 27/307* (2013.01); *H01L 51/4253* (2013.01); *H01L 51/441* (2013.01);
              (Continued)

(58) Field of Classification Search
CPC ............... H01L 27/307; H01L 51/0046; H01L 51/0053; H01L 51/006; H01L 51/0061;
(Continued)

(56) References Cited

U.S. PATENT DOCUMENTS 5,849,403 A * 12/1998 Aoki .................. H01L 51/0051
                                                  428/220
6,300,612 B1    10/2001   Yu
                (Continued)

FOREIGN PATENT DOCUMENTS

CN         1941444 A      4/2007
CN       101842917 A      9/2010
             (Continued)

OTHER PUBLICATIONS

Efficient, bulk heterojunction organic photovoltaic cells based on boron subphthalocyanine chloride-C70, Pandey et al., Applied Physics Letters 101, 033308 (2012).
(Continued)

*Primary Examiner* — Mohammed Shamsuzzaman
(74) *Attorney, Agent, or Firm* — Harness, Dickey & Pierce, P.L.C.

(57) ABSTRACT

An organic photoelectronic device includes a first electrode and a second electrode facing each other and a light-absorption layer between the first electrode and the second electrode and including a first region closest to the first electrode, the first region having a first composition ratio $(p_1/n_1)$ of a p-type semiconductor relative to an n-type semiconductor, a second region closest to the second electrode, the second region having a second composition ratio $(p_2/n_2)$ of the p-type semiconductor relative to the n-type semiconductor, and a third region between the first region and the second region in a thickness direction, the third region having a third composition ratio $(p_3/n_3)$ of the p-type
(Continued)

semiconductor relative to the n-type semiconductor that is greater or less than the first composition ratio ($p_1/n_1$) and the second composition ratio ($p_2/n_2$).

20 Claims, 19 Drawing Sheets

Related U.S. Application Data division of application No. 15/156,438, filed on May 17, 2016, now Pat. No. 10,008,545.

(51) Int. Cl.
*H01L 51/44* (2006.01)
*H01L 51/00* (2006.01)

(52) U.S. Cl.
CPC ........ *H01L 51/006* (2013.01); *H01L 51/0046* (2013.01); *H01L 51/0053* (2013.01); *H01L 51/0061* (2013.01); *H01L 51/0062* (2013.01); *Y02E 10/549* (2013.01)

(58) Field of Classification Search
CPC ............. H01L 51/0062; H01L 51/4253; H01L 51/441; Y02E 10/549
See application file for complete search history.

(56) References Cited

U.S. PATENT DOCUMENTS

| | | | |
|---|---|---|---|
| 7,129,466 | B2 | 10/2006 | Iwasaki |
| 7,569,866 | B2 | 8/2009 | Konno et al. |
| 7,973,307 | B2 | 7/2011 | Rand et al. |
| 8,035,708 | B2 | 10/2011 | Takizawa et al. |
| 8,426,727 | B2 | 4/2013 | Pfeiffer et al. |
| 8,525,577 | B2 | 9/2013 | Yofu et al. |
| 8,658,290 | B2 | 2/2014 | Koenemann et al. |
| 9,070,887 | B2 | 6/2015 | Yofu et al. |
| 9,660,207 | B2 | 5/2017 | Ihn et al. |
| 10,043,992 | B2 | 8/2018 | Park et al. |
| 10,256,414 | B2 | 4/2019 | Lim et al. |
| 2007/0012955 | A1 | 1/2007 | Ihama |
| 2010/0207114 | A1 | 8/2010 | Koenemann et al. |
| 2011/0074491 | A1 | 3/2011 | Yofu et al. |
| 2011/0100465 | A1 | 5/2011 | Horng et al. |
| 2012/0125437 | A1* | 5/2012 | Okawara ................ H01L 51/448 136/259 |
| 2012/0199186 | A1 | 8/2012 | Okubo et al. |
| 2012/0313088 | A1 | 12/2012 | Yofu et al. |
| 2013/0062595 | A1* | 3/2013 | Park .................... H01L 51/4253 257/40 |
| 2013/0105768 | A1* | 5/2013 | Leem ................... H01L 51/4273 257/40 |
| 2013/0112947 | A1* | 5/2013 | Lee ...................... H01L 51/0068 257/40 |
| 2013/0299799 | A1 | 11/2013 | Yofu et al. |
| 2016/0197281 | A1* | 7/2016 | Momose ............. H01L 51/0036 136/256 |
| 2018/0323389 | A1 | 11/2018 | Park et al. |

FOREIGN PATENT DOCUMENTS

| | | | |
|---|---|---|---|
| CN | 102034933 | A | 4/2011 |
| CN | 103000810 | A | 3/2013 |
| EP | 01447860 | A1 | 8/2004 |
| EP | 2317582 | A1 | 5/2011 |
| JP | 200673856 | A | 3/2006 |
| JP | 2011504292 | A | 2/2011 |
| JP | 201154869 | A | 3/2011 |
| JP | 201177198 | A | 4/2011 |
| JP | 201362503 | A | 4/2013 |
| JP | 2013-149662 | A | 8/2013 |
| JP | 2013168612 | A | 8/2013 |
| JP | 2014033165 | A | 2/2014 |
| JP | 2014131065 | A | 7/2014 |
| JP | 2015032736 | A | 2/2015 |
| KR | 2013-0028488 | A | 3/2013 |
| KR | 2014-0015180 | A | 2/2014 |
| KR | 2015-0066616 | A | 6/2015 |
| WO | WO-2004073082 | A1 | 8/2004 |
| WO | WO-2009/056626 | A1 | 5/2009 |
| WO | WO-2010038721 | A1 | 4/2010 |

OTHER PUBLICATIONS

Schultes, et al. "The role of molecular architecture and layer composition on the properties and performance of CuPc-C60 photovoltaic devices," Materials Science and Engineering, C 25, pp. 858-865 (2005).

Extended European Search Report dated Nov. 28, 2016 issued in corresponding European Patent Application No. 16173355.5.

Japanese Office Action dated Feb. 25, 2020, issued in corresponding Japanese Patent Application No. 2016-131496.

Office Action for European Application No. 16173355.5 dated Sep. 25, 2020.

B. Tremolet De Villers et al. 'Linking Vertical Bulk-Heterojunction Composition and Transient Photocurrent Dynamics in Organic Solar Cells with Solution-Processed MoOx Contact Layers' *Advanced Energy Materials*, 2014, 1301290, pp. 1-10.

O. Synooka et al. 'Influence of Thermal Annealing on PCDTBT:PCBM Composition Profiles' *Advanced Energy Materials*, 2014, 1300981, pp. 1-10.

Office Action dated Dec. 23, 2020, issued in corresponding Korean Patent Application No. 10-2015-0095356.

Office Action dated Apr. 2, 2021, issued in corresponding Chinese Patent Application No. 201610515592.X.

\* cited by examiner

ORGANIC PHOTOELECTRONIC DEVICE AND IMAGE SENSOR

CROSS REFERENCE TO RELATED APPLICATION

This application is a divisional of U.S. application Ser. No. 15/986,956, filed on May 23, 2018, which is a divisional of U.S. application Ser. No. 15/156,438, filed on May 17, 2016, which claims priority to the benefit of Korean Patent Application No. 10-2015-0095356 filed in the Korean Intellectual Property Office on Jul. 3, 2015, the entire contents of each of the above-referenced applications are hereby incorporated by reference.

BACKGROUND

1. Field

Example embodiments relate to an organic photoelectronic device and an image sensor.

2. Description of the Related Art

A photoelectronic device typically converts light into an electrical signal using photoelectric effects. The photoelectronic device may include a photodiode and/or a phototransistor, and may be applied to an image sensor, a solar cell and/or an organic light emitting diode.

An image sensor including a photodiode typically requires higher resolution and thus a smaller pixel. At present, a silicon photodiode is widely used, but exhibits deteriorated sensitivity because of a relatively small absorption area due to the relatively small pixels. Accordingly, an organic material that is capable of replacing silicon has been researched.

An organic material has a relatively high extinction coefficient and selectively absorbs light in a particular wavelength region depending on a molecular structure, and thus may simultaneously replace a photodiode and a color filter and as a result improve sensitivity and contribute to higher integration.

SUMMARY

Example embodiments provide an organic photoelectronic device capable of improving wavelength selectivity.

Example embodiments provide an image sensor including the organic photoelectronic device.

According to example embodiments, an organic photoelectronic device includes a first electrode and a second electrode facing each other, and a light-absorption layer between the first electrode and the second electrode. The light-absorption layer includes a first region closest to the first electrode, a second region closest to the second electrode, and a third region between the first region and the second region in a thickness direction. The first region has a first composition ratio $(p_1/n_1)$ of a p-type semiconductor relative to an n-type semiconductor, the second region has a second composition ratio $(p_2/n_2)$ of the p-type semiconductor relative to the n-type semiconductor, and the third region has a third composition ratio $(p_3/n_3)$ of the p-type semiconductor relative to the n-type semiconductor that is greater or less than the first composition ratio $(p_1/n_1)$ and the second composition ratio $(p_2/n_2)$.

The first composition ratio $(p_1/n_1)$ may be the same as the second composition ratio $(p_2/n_2)$.

The first composition ratio $(p_1/n_1)$ may be different from the second composition ratio $(p_2/n_2)$.

A composition ratio (p/n) of the p-type semiconductor relative to the n-type semiconductor of the light-absorption layer may be continuously increased and then decreased along the thickness direction.

A composition ratio (p/n) of the p-type semiconductor relative to the n-type semiconductor of the light-absorption layer may be discontinuously increased and then decreased along the thickness direction.

A composition ratio (p/n) of the p-type semiconductor relative to the n-type semiconductor of the light-absorption layer may be continuously decreased and then increased along the thickness direction.

A composition ratio (p/n) of the p-type semiconductor relative to the n-type semiconductor of the light-absorption layer may be discontinuously decreased and then increased along the thickness direction.

The light-absorption layer may be configured to absorb light in at least one part of a visible ray wavelength region, and a maximum light-absorption position of the light-absorption layer may be different depending on the visible ray wavelength region.

The visible ray wavelength region may include first visible light and second visible light having a different wavelength region from the first visible light, and the first visible light may be absorbed at a maximum in one of the first region and the second region of the light-absorption layer and the second visible light may be absorbed at a maximum in the third region of the light-absorption layer.

One of the p-type semiconductor and the n-type semiconductor may be a light-absorbing material configured to selectively absorb the first visible light, and the other of the p-type semiconductor and the n-type semiconductor may be a light-absorbing material configured to absorb the first visible light and the second visible light.

The p-type semiconductor may be the light-absorbing material configured to selectively absorb the first visible light, the n-type semiconductor may be the light-absorbing material configured to absorb the first visible light and the second visible light, and the third composition ratio $(p_3/n_3)$ may be greater than the first composition ratio $(p_1/n_1)$ and the second composition ratio $(p_2/n_2)$.

The third region may include the n-type semiconductor in a lesser amount than the first region and the second region.

The n-type semiconductor may be the light-absorbing material configured to selectively absorb the first visible light, the p-type semiconductor may be the light-absorbing material configured to absorb the first visible light and the second visible light, and the third composition ratio $(p_3/n_3)$ may be less than the first composition ratio $(p_1/n_1)$ and the second composition ratio $(p_2/n_2)$.

The third region may include the p-type semiconductor in a lesser amount than the first region and the second region.

The first visible light may have a wavelength region of about 500 nm to about 600 nm, and the second visible light may have a wavelength region of greater than or equal to about 380 nm and less than 500 nm.

One of the p-type semiconductor and the n-type semiconductor may include one of C60, C70, a derivative thereof, and a combination thereof.

According to example embodiments, an image sensor includes the organic photoelectronic device.

The light-absorption layer may be configured to absorb light in at least one part of a visible ray wavelength region, the visible ray wavelength region may include first visible light, second visible light, and third visible light, each of the first, second and third visible light having a different wavelength region, the organic photoelectronic device may be configured to selectively absorb the first visible light, and the image sensor may further include a semiconductor substrate integrated with a plurality of first photo-sensing devices configured to sense the second visible light and a plurality of second photo-sensing devices configured to sense the third visible light.

The plurality of first photo-sensing devices and the plurality of second photo-sensing devices may be spaced apart from each other in a horizontal direction.

The image sensor may further include a first color filter overlapping the plurality of first photo-sensing devices and configured to selectively transmit the second visible light, and a second color filter overlapping the plurality of second photo-sensing devices and configured to selectively transmit the third visible light.

The plurality of first photo-sensing devices and the plurality of second photo-sensing devices may be spaced apart from each other in a vertical direction.

The light-absorption layer may be configured to absorb light in at least one part of a visible ray wavelength region, the visible ray wavelength region may include first visible light, second visible light, and third visible light, each of the first, second and third visible light having a different wavelength region, the organic photoelectronic device may be a first organic photoelectronic device configured to selectively absorb the first visible light, the image sensor may further include a second organic photoelectronic device configured to selectively absorb the second visible light and a third organic photoelectronic device configured to selectively absorb the third visible light, and the first organic photoelectronic device, the second organic photoelectronic device, and the third organic photoelectronic device may be sequentially stacked.

The first visible light may have a wavelength region of about 500 nm to about 600 nm, the second visible light may have a wavelength region of greater than or equal to about 380 nm and less than 500 nm, and the third visible light may have a wavelength region of greater than about 600 nm and less than or equal to about 780 nm.

According to example embodiments, an electronic device includes the image sensor.

According to example embodiments, an organic photoelectronic device includes a first electrode, a first light-absorption layer on the first electrode, the first light-absorption layer having a first composition ratio ($p_1/n_1$) of a p-type semiconductor relative to an n-type semiconductor, a second light-absorption layer on the first light-absorption layer, the second light-absorption layer having a second composition ratio ($p_2/n_2$) of the p-type semiconductor relative to the n-type semiconductor different from the first composition ratio ($p_1/n_1$), a third light-absorption layer on the second light-absorption layer, the third light-absorption layer having the first composition ratio ($p_1/n_1$), and a second electrode on the third light-absorption layer.

The second composition ratio ($p_2/n_2$) may be greater than the first composition ratio ($p_1/n_1$).

The second light-absorption layer may include the n-type semiconductor in a lesser amount than the first light-absorption layer and the third light-absorption layer.

DETAILED DESCRIPTION

Figure 1:
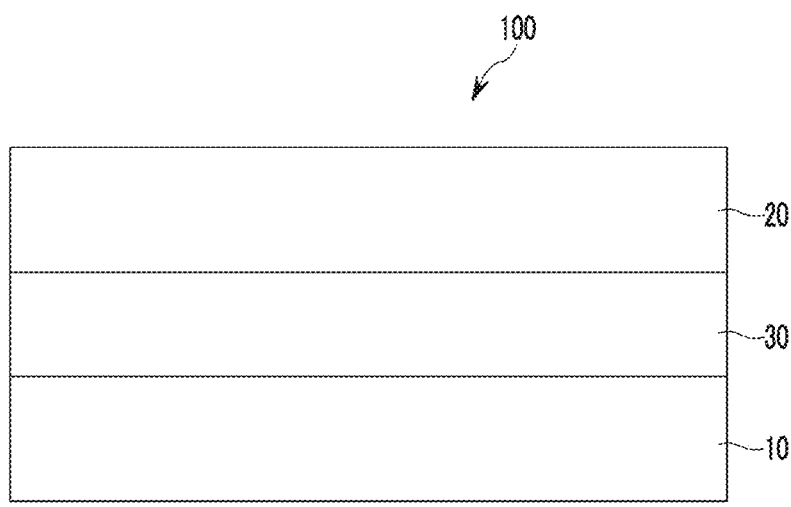
FIG. 1 is a cross-sectional view showing an organic photoelectronic device according to example embodiments.

Example embodiments will hereinafter be described in detail, and may be more easily performed by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the drawings, parts having no relationship with the description are omitted for clarity of the embodiments, and the same or similar constituent elements are indicated by the same reference numerals throughout the specification.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Hereinafter, an organic photoelectronic device according to example embodiments is described with reference to drawings.

Figure 2:
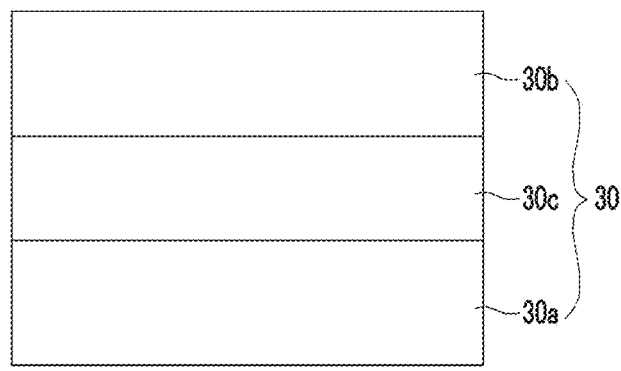
FIG. 2 is a cross-sectional view showing the light-absorption layer of the organic photoelectronic device of FIG. 1, FIGS. 3 to 6 show examples of changes of composition ratios of the p-type semiconductor and the n-type semiconductor in the first to third regions of the light-absorption layer of FIG. 2, respectively.

FIG. 1 is a cross-sectional view showing an organic photoelectronic device according to example embodiments, and FIG. 2 is a cross-sectional view of the light-absorption layer of the organic photoelectronic device of FIG. 1.

Referring to FIG. 1, an organic photoelectronic device 100 according to example embodiments includes a first electrode 10 and a second electrode 20 facing each other, and a light-absorption layer 30 between the first electrode 10 and the second electrode 20.

One of the first electrode 10 and the second electrode 20 is an anode and the other is a cathode. At least one of the first electrode 10 and the second electrode 20 may be a light-transmitting electrode, and the light-transmitting electrode may be made of, for example, a conductive oxide (e.g., indium tin oxide (ITO) or indium zinc oxide (IZO)), or a metal thin layer of a thin monolayer or multilayer. When one of the first electrode 10 and the second electrode 20 is a non-light-transmitting electrode, the non-light-transmitting electrode may be made of, for example, an opaque conductor (e.g., aluminum (Al)).

For example, the first electrode 10 and the second electrode 20 may be light-transmitting electrodes.

The light-absorption layer 30 includes a p-type semiconductor and an n-type semiconductor to form a pn junction, and absorbs external light to generate excitons and then separates the generated excitons into holes and electrons.

The light-absorption layer 30 may absorb light in at least one part of a wavelength region of a visible ray, and may selectively absorb, for example a part of green light of about 500 nm to about 600 nm, blue light of greater than or equal to about 380 nm and less than about 500 nm, and red light of greater than about 600 nm and less than or equal to about 780 nm.

At least one of the p-type semiconductor and the n-type semiconductor may be a light-absorbing material selectively absorbing one of green light, blue light, and red light.

For example, one of the p-type semiconductor and the n-type semiconductor may be a light-absorbing material selectively absorbing one of green light, blue light, and red light, and the other of the p-type semiconductor and the n-type semiconductor may be a light-absorbing material selectively absorbing two or more of green light, blue light, and red light.

For example, one of the p-type semiconductor and the n-type semiconductor may be a light-absorbing material selectively absorbing green light and the other of the p-type semiconductor and the n-type semiconductor may be a light-absorbing material selectively absorbing blue light and/or red light together with the green light.

For example, the p-type semiconductor may be a light-absorbing material selectively absorbing green light and the n-type semiconductor may be a light-absorbing material selectively absorbing blue light and/or red light together with the green light.

For example, the n-type semiconductor may be a light-absorbing material selectively absorbing green light and the p-type semiconductor may be a light-absorbing material selectively absorbing blue light and/or red light together with the green light.

For example, the p-type semiconductor may be a light-absorbing material selectively absorbing green light and the n-type semiconductor may be a light-absorbing material selectively absorbing blue light together with the green light.

For example, the n-type semiconductor may be a light-absorbing material selectively absorbing green light and the p-type semiconductor may be a light-absorbing material selectively absorbing blue light together with the green light.

The light-absorbing material selectively absorbing green light may be, for example, quinacridone or a derivative thereof, sub-phthalocyanine or a derivative thereof and the light-absorbing material absorbing green light and blue light may be, for example C60, C70, a derivative thereof, or a combination thereof. However, they are not limited thereto.

The light-absorption layer 30 may mainly absorb light in a different wavelength region depending on its region, for example, in a different wavelength region along the thickness direction of the light-absorption layer 30. For example, green light may mainly be absorbed in a closer region to the incident side of the light-absorption layer 30, and blue light may mainly be absorbed in its middle region, namely an inside region of the light-absorption layer 30.

In example embodiments, the p-type semiconductor and/or the n-type semiconductor may differently be distributed depending on a region where light in each wavelength region is mainly absorbed, considering that the absorption position of the light-absorption layer 30 is different depending on the wavelength region of a visible ray. Accordingly, wavelength selectivity may be increased by adjusting the absorption wavelength region of the light-absorption layer 30 and thus reinforcing absorption in a desired wavelength region but suppressing absorption in an undesired wavelength region.

The light-absorption layer 30 may include a bulk heterojunction of the p-type semiconductor and the n-type semiconductor, and a mixing ratio of the p-type semiconductor and the n-type semiconductor, that is, a p/n composition ratio (p/n ratio) may be controlled to be different depending on a position of the light-absorption layer 30. Herein, the p/n composition ratio may be defined as the volume of the p-type semiconductor relative to the volume of the n-type semiconductor. The p/n composition ratio may have an influence on an absorption rate and efficiency.

The light-absorption layer 30 may include a plurality of regions having a different p/n composition ratio along the thickness direction. For example, referring to FIG. 2, the light-absorption layer 30 may include a first region 30a, a second region 30b, and a third region 30c between the first region 30a and the second region 30b. For example, the first region 30a may be a region nearest to the first electrode 10 and the second region 30b may be a region nearest to the second electrode 20. The first region 30a or the second region 30b may be closer to an incident side, and the third region 30c may be a middle region of the light-absorption layer 30.

The third region 30c may have a different p/n composition ratio from those of the first region 30a and the second region 30b, and the p/n composition ratio of the third region 30c may be smaller or larger than those of the first region 30a and the second region 30b.

For example, when a composition ratio of the volume of the p-type semiconductor relative to the volume of the n-type semiconductor of the first region 30a is referred to $p_1/n_1$, a composition ratio of the volume of the p-type semiconductor relative to the volume of the n-type semiconductor of the second region 30b is referred to as $p_2/n_2$, and a composition ratio of the volume of the p-type semiconductor relative to the volume of the n-type semiconductor of the third region 30c is referred to as $p_3/n_3$, the composition ratios of the first region 30a, the second region 30b, and the third region 30c of the light-absorption layer 30 may satisfy Relationship Equations 1 and 2.

$$p_3/n_3 > p_1/n_1 \quad \text{[Relationship Equation 1]}$$

$$p_3/n_3 > p_2/n_2 \quad \text{[Relationship Equation 2]}$$

For example, Relationship Equations 1 and 2 may be applied when the p-type semiconductor is a light-absorbing material selectively absorbing green light and the n-type semiconductor is a light-absorbing material absorbing green light and blue light. In example embodiments, absorption of blue light of the n-type semiconductor may be reduced and external quantum efficiency (EQE) of blue light may be also reduced by relatively increasing the volume of the p-type semiconductor relative to the volume of the n-type semiconductor in a middle region of the light-absorption layer 30 mainly absorbing blue light, that is the third region 30c. Accordingly, green wavelength selectivity of the light-absorption layer 30 may be increased.

For example, Relationship Equations 1 and 2 may be satisfied by reducing the content of the n-type semiconductor of the third region 30c, while the first region 30a, the second region 30b, and the third region 30c maintain the same content of the p-type semiconductor.

For another example, a composition ratio of the first region 30a, the second region 30b, and the third region 30c of the light-absorption layer 30 may satisfy Relationship Equations 3 and 4.

$$p_3/n_3 < p_1/n_1 \quad \text{[Relationship Equation 3]}$$

$$p_3/n_3 < p_2/n_2 \quad \text{[Relationship Equation 4]}$$

For example, Relationship Equations 3 and 4 may be applied when the n-type semiconductor is a light-absorbing material selectively absorbing green light and the p-type semiconductor is a light-absorbing material absorbing green light and blue light. Herein, the volume of the p-type semiconductor relative to the volume of the n-type semiconductor in the middle region of the light-absorption layer 30 mainly absorbing blue light, that is, the third region 30c may be relatively reduced to decrease absorption of blue light by the n-type semiconductor and also, external quantum efficiency (EQE) of the blue light. Accordingly, green wavelength selectivity of the light-absorption layer 30 may be increased.

For example, Relationship Equations 3 and 4 may be satisfied by reducing the content of the p-type semiconductor in the third region 30c, while the first region 30a, the second region 30b, and the third region 30c may maintain the same content of the n-type semiconductor.

When Relationship Equations 1 and 2 or 3 and 4 may be satisfied, the ratio ($p_1/n_1$) of the volume of the p-type semiconductor of the first region 30a relative to the volume of the n-type semiconductor may be the same as or different from the ratio ($p_2/n_2$) of the volume of the p-type semiconductor of the second region 30b relative to the volume of the n-type semiconductor, and the composition ratios of the first region 30a and the second region 30b of the light-absorption layer 30 may satisfy one of Relationship Equations 5 to 7.

$$p_1/n_1 = p_2/n_2 \quad \text{[Relationship Equation 5]}$$

$$p_1/n_1 > p_2/n_2 \quad \text{[Relationship Equation 6]}$$

$$p_1/n_1 < p_2/n_2 \quad \text{[Relationship Equation 7]}$$

For example, the first region 30a, the second region 30b, and the third region 30c of the light-absorption layer 30 may have a composition ratio satisfying one of Relationship Equations 8 to 10.

$$p_3/n_3 > p_1/n_1 = p_2/n_2 \quad \text{[Relationship Equation 8]}$$

$$p_3/n_3 > p_1/n_1 > p_2/n_2 \quad \text{[Relationship Equation 9]}$$

$$p_3/n_3 > p_2/n_2 > p_1/n_1 \quad \text{[Relationship Equation 10]}$$

For another example, the first region 30a, the second region 30b, and the third region 30c of the light-absorption layer 30 may have a composition ratio satisfying Relationship Equations 11 to 13.

$$p_3/n_3 < p_1/n_1 = p_2/n_2 \quad \text{[Relationship Equation 11]}$$

$$p_3/n_3 < p_1/n_1 < p_2/n_2 \quad \text{[Relationship Equation 12]}$$

$$p_3/n_3 < p_2/n_2 < p_1/n_1 \quad \text{[Relationship Equation 13]}$$

Figure 3:
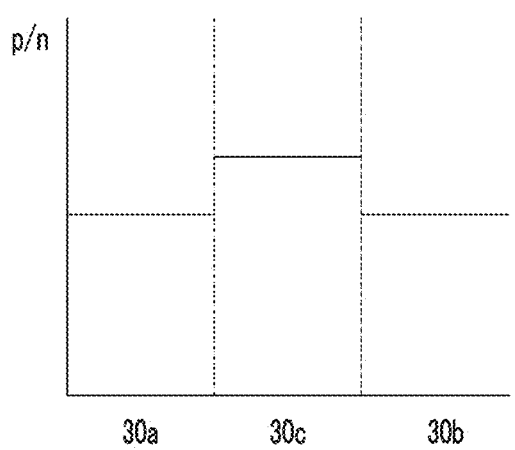
Figure 4:
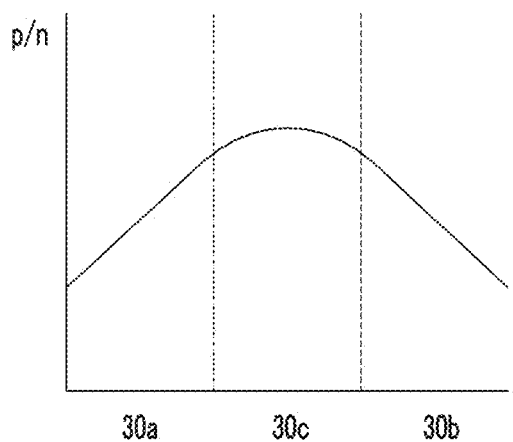

FIGS. 3 to 6 show examples of changes of composition ratios of the p-type semiconductor and the n-type semiconductor in the first to third regions 30a, 30b, and 30c of the light-absorption layer of FIG. 2, respectively Referring to FIGS. 3 and 4, a p/n composition ratio of the light-absorption layer 30 may be discontinuously or continuously increased and then decreased along the thickness direction of the light-absorption layer 30.

Specifically, referring to FIG. 3, the third region 30c may have a larger p/n composition ratio than those of the first region 30a and the second region 30b, and thus the p/n composition ratio of the light-absorption layer 30 may be discontinuously increased and then, decreased along the first region 30a, the third region 30c, and the second region 30b. Herein, the term of 'discontinuous' may mean to have at least one intermittent point and include all the changes except for a gradual or continuous change.

In FIG. 3, the first region 30a has a constant p/n composition ratio along the thickness direction, the second region 30b has a constant p/n composition ratio along the thickness direction, and the third region 30c has a constant p/n composition ratio along the thickness direction, but is not limited thereto, and thus the p/n composition ratio in the first region 30a, the second region 30b or the third region 30c may be changed.

Referring to FIG. 4, the third region 30c may have a larger p/n composition ratio than those of the first region 30a and the second region 30b, and thus the p/n composition ratio of the light-absorption layer 30 may be continuously increased and then, decreased along the first region 30a, the third region 30c, and the second region 30b. Herein, the term of 'continuous' may mean gradually changed at a constant or inconstant rate.

Figure 5:
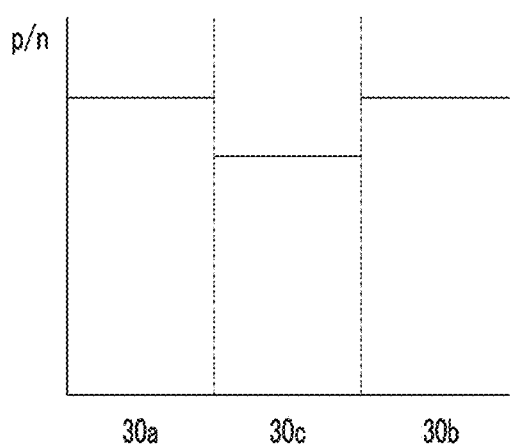
Figure 6:
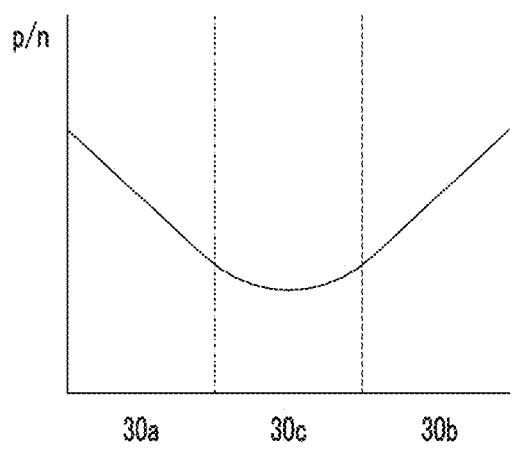

Referring to FIGS. 5 and 6, the p/n composition ratio of the light-absorption layer 30 may be discontinuously or continuously decreased and then, increased along the thickness direction of the light-absorption layer 30.

Specifically, referring to FIG. 5, the third region 30c may have a smaller than those of the first region 30a and the second region 30b, and the p/n composition ratio may be discontinuously decreased and then, increased along the first region 30a, the third region 30c, and the second region 30b. In FIG. 5, each first region 30a, second region 30b, and third region 30c has a constant p/n composition ratio but is not limited thereto, and the p/n composition ratio in each first region 30a, second region 30b, and third region 30c may be changed.

Referring to FIG. 6, the third region 30c has a smaller p/n composition ratio than those of the first region 30a and the second region 30b, and thus the p/n composition ratio of the light-absorption layer 30 may be continuously decreased and then, increased along the first region 30a, the third region 30c, and the second region 30b.

In this way, wavelength selectivity may be increased by changing the p/n composition ratio along the thickness direction of the light-absorption layer 30 and thus reinforcing absorption in a desired wavelength region and suppressing absorption in an undesired wavelength region, considering that the absorption region of the light-absorption layer 30 is changed depending on wavelength region of a visible ray in example embodiments.

Specifically, the external quantum efficiency (EQE) of the organic photoelectronic device 100 may be proportional to the absorbance and internal quantum efficiency (IQE) of the light-absorption layer 30, and the internal quantum efficiency (IQE) may be classified into charge separation efficiency (CS) and charge collection efficiency (CC).

According to example embodiments, light absorbance and charge separation efficiency in the desired wavelength region may be secured by including the p-type semiconductor and the n-type semiconductor in a p/n composition ratio capable of exerting an optimal efficiency of absorbing light in the desired wavelength region. Simultaneously, light absorbance and charge separation efficiency in the undesired wavelength region may be reduced by changing the p/n composition ratio into a p/n composition ratio capable of decreasing efficiency of absorbing light in the undesired wavelength region. Accordingly, wavelength selectivity may be increased by securing light absorbance and external quantum efficiency (EQE) in the desired wavelength region and simultaneously suppressing light absorbance and external quantum efficiency in the undesired wavelength region.

The light-absorption layer 30 may include the p-type semiconductor and the n-type semiconductor in a volume ratio of about 10:1 to about 1:10, for example, about 8:2 to about 2:8 or about 6:4 to about 4:6.

The third region 30c of the light-absorption layer may have about 5% to 80% larger or smaller p/n composition ratio, about 10% to 60% larger or smaller p/n composition ratio within the range, and about 10% to 50% larger or smaller p/n composition within the range than that of the first region 30a or the second region 30b.

The light-absorption layer 30 may be an intrinsic layer (I layer), and may further include a p-type layer and/or an n-type layer on one side or both sides of the light-absorption layer 30. For example, the organic photoelectronic device 100 may include various combinations of a p-type layer/I layer, an I layer/n-type layer, a p-type layer/I layer/n-type layer, etc., between the first electrode 10 and the second electrode 20. The p-type layer may include a p-type semiconductor and the n-type layer may include an n-type semiconductor.

The light-absorption layer 30 may have a thickness of about 1 nm to about 500 nm, and for example, about 5 nm to about 300 nm. When the light-absorption layer 30 has a thickness within the range, the light-absorption layer 30 may effectively absorb light, effectively separate holes from electrons, and deliver them, thereby effectively improving photoelectronic conversion efficiency.

In the organic photoelectronic device 100, when light enters from the first electrode 10 and/or second electrode 20, and when the light-absorption layer 30 absorbs light having a given or predetermined wavelength region, excitons may be produced from the inside. The excitons are separated into holes and electrons in the light-absorption layer 30, and the separated holes are transported to an anode that is one of the first electrode 10 and second electrode 20 and the separated electrons are transported to the cathode that is the other of and the first electrode 10 and second electrode 20 so as to flow a current in the organic photoelectronic device.

Hereinafter, an organic photoelectronic device according to example embodiments is illustrated.

Figure 7:
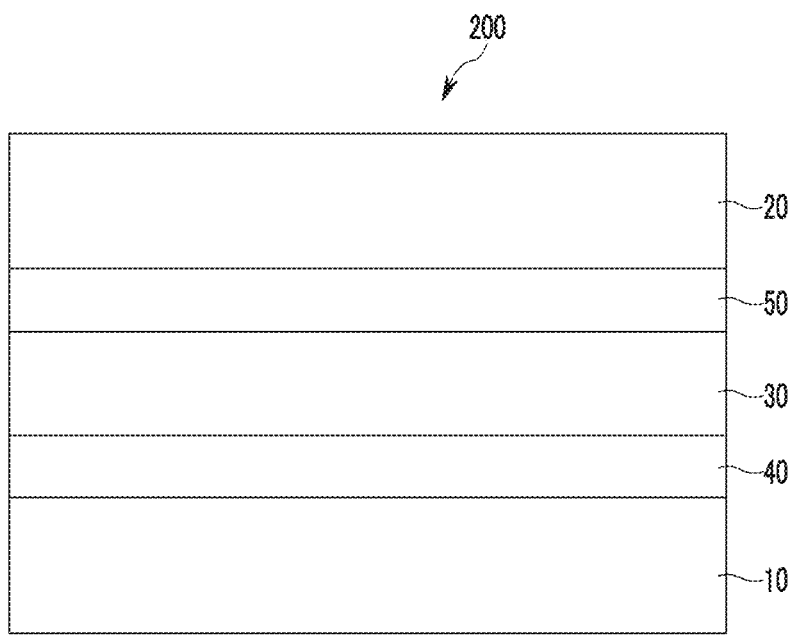
FIG. 7 is a cross-sectional view showing an organic photoelectronic device according to example embodiments.

FIG. 7 is a cross-sectional view showing an organic photoelectronic device according to example embodiments.

Referring to FIG. 7, an organic photoelectronic device 200 includes a first electrode 10 and a second electrode 20 facing each other, and the light-absorption layer 30 between the first electrode 10 and the second electrode 20, like the example embodiment illustrated in FIG. 1. The first electrode 10, the second electrode 20, and the light-absorption layer 30 are the same as described above.

However, the organic photoelectronic device 200 according to example embodiments further includes charge auxiliary layers 40 and 50 between the first electrode 10 and the light-absorption layer 30 and the second electrode 20 and the light-absorption layer 30, unlike the example embodiment illustrated in FIG. 1. The charge auxiliary layers 40 and 50 may facilitate the transfer of holes and electrons separated from the light-absorption layer 30, so as to increase efficiency.

The charge auxiliary layers 40 and 50 may be at least one selected from a hole injection layer (HIL) for facilitating hole injection, a hole transport layer (HTL) for facilitating hole transport, an electron blocking layer (EBL) for preventing or inhibiting electron transport, an electron injection layer (EIL) for facilitating electron injection, an electron transport layer (ETL) for facilitating electron transport, and a hole blocking layer (HBL) for preventing or inhibiting hole transport.

The charge auxiliary layers 40 and 50 may include, for example, an organic material, an inorganic material, or an organic/inorganic material. The organic material may be an organic compound having hole or electron characteristics, and the inorganic material may be, for example, a metal oxide, e.g., molybdenum oxide, tungsten oxide, nickel oxide, etc.

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, Ings, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, Ings, $Znq_2$, $Zn(BTZ)_2$, $BeBq_2$, and a combination thereof, but is not limited thereto.

Either one of the charge auxiliary layers 40 and 50 may be omitted.

The organic photoelectronic device may be applied to a solar cell, an image sensor, a photo-detector, a photo-sensor, and an organic light emitting diode (OLED), but is not limited thereto.

The organic photoelectronic device may be for example applied to an image sensor.

Hereinafter, an example of an image sensor including the organic photoelectronic device is described referring to drawings. As an example of an image sensor, an organic CMOS image sensor is illustrated.

Figure 8:
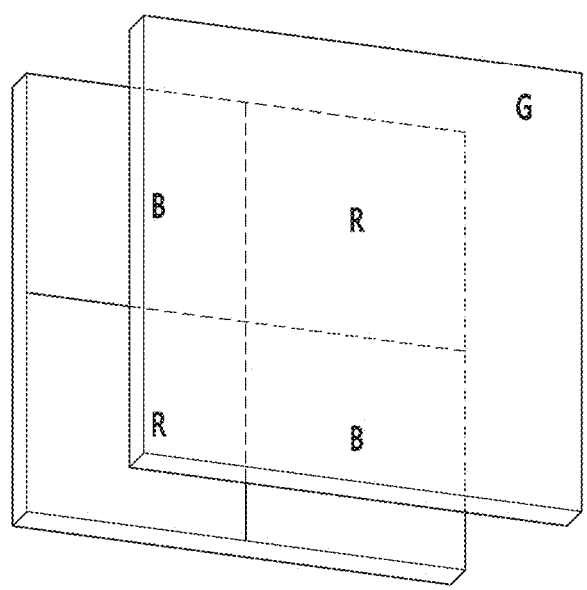
FIG. 8 is a schematic top plan view showing an organic CMOS image sensor according to example embodiments.
Figure 9:
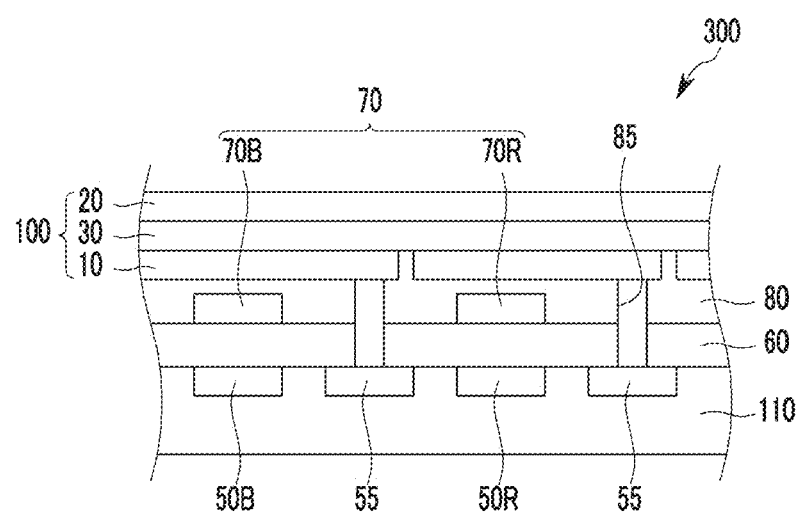
FIG. 9 is a cross-sectional view showing one example of the organic CMOS image sensor of FIG. 8.

FIG. 8 is a schematic top plan view of an organic CMOS image sensor according to example embodiments and FIG. 9 is a cross-sectional view showing one example of the organic CMOS image sensor of FIG. 8.

Referring to FIGS. 8 and 9, an organic CMOS image sensor 300 according to example embodiments includes a semiconductor substrate 110 integrated with photo-sensing devices 50B and 50R, a transmission transistor (not shown), and a charge storage device 55, a lower insulation layer 60, a color filter layer 70, an upper insulation layer 80, and an organic photoelectronic device 100.

The semiconductor substrate 110 may be a silicon substrate, and is integrated with the photo-sensing devices 50B and 50R, the transmission transistor (not shown), and the charge storage device 55. The photo-sensing devices 50R and 50B may be photodiodes.

The photo-sensing devices 50B and 50R, the transmission transistor, and/or the charge storage device 55 may be integrated in each pixel, and as shown in the drawing, the photo-sensing devices 50B and 50R may be included in a blue pixel and a red pixel and the charge storage device 55 may be included in a green pixel.

The photo-sensing devices 50B and 50R sense light, the information sensed by the photo-sensing devices may be transferred by the transmission transistor, and the charge storage device 55 is electrically connected with the organic photoelectronic device 100, so the information of the charge storage 55 may be transferred by the transmission transistor.

A metal wire (not shown) and a pad (not shown) are formed on the semiconductor substrate 110. In order to decrease signal delay, the metal wire and pad may be made of a metal having relatively low resistivity, for example, aluminum (Al), copper (Cu), silver (Ag), and alloys thereof, but is not limited thereto. However, example embodiments are not limited to the structure illustrated, and the metal wire and pad may be positioned under the photo-sensing devices 50B and 50R.

The lower insulation layer 60 is formed on the metal wire and the pad. The lower insulation layer 60 may be made of an inorganic insulating material (e.g., a silicon oxide and/or a silicon nitride), or a low dielectric constant (low K) material (e.g., SiC, SiCOH, SiCO, and SiOF). The lower insulation layer 60 has a trench exposing the charge storage 55. The trench may be filled with fillers.

A color filter layer 70 is formed on the lower insulation layer 60. The color filter layer 70 includes a blue filter 70B formed in the blue pixel and a red filter 70R filled in the red pixel. In example embodiments, a green filter is not included, but a green filter may be further included.

The upper insulation layer 80 is formed on the color filter layer 70. The upper insulation layer 80 eliminates a step caused by the color filter layer 70 and smoothes the surface. The upper insulation layer 80 and lower insulation layer 60 may include a contact hole (not shown) exposing a pad, and a through-hole 85 exposing the charge storage device 55 of a green pixel.

The organic photoelectronic device 100 is formed on the upper insulation layer 80. The organic photoelectronic device 100 includes the first electrode 10, the light-absorption layer 30, and the second electrode 20 as described above.

The first electrode 10 and the second electrode 20 may be transparent electrodes, and the light-absorption layer 30 is the same as described above. The light-absorption layer 30 may selectively absorb light in a green wavelength region and replace a color filter of a green pixel.

When light enters from the second electrode 20, the light in a green wavelength region may be mainly absorbed in the light-absorption layer 30 and photoelectrically converted, while the light in the rest of the wavelength regions passes through the first electrode 10 and may be sensed in photo-sensing devices 50B and 50R.

As described above, the organic photoelectronic device configured to selectively absorb light in a green wavelength region has a stack structure, and thus the size of an image sensor may be reduced to realize a down-sized image sensor. In addition, as described above, a crosstalk due to unnecessary adsorption of light in other wavelength regions except green may be reduced and sensitivity of an image sensor may be increased by improving green wavelength selectivity in the light-absorption layer 30 of the organic photoelectronic device 100.

In FIG. 9, the organic photoelectronic device 100 of FIG. 1 is included, but example embodiments not limited thereto, and thus the organic photoelectronic device 200 of FIG. 7 may be applied in the same manner.

In FIGS. 8 and 9, a stack structure where an organic photoelectronic device configured to selectively absorb light in a green wavelength region is stacked is exemplarily illustrated, but the present disclosure is not limited thereto. The present disclosure may have a structure where an organic photoelectronic device configured to selectively absorb light in a blue wavelength region is stacked and a green photo-sensing device and a red photo-sensing device may be integrated in the semiconductor substrate 110, or a structure where an organic photoelectronic device configured to selectively absorb light in a red wavelength region is stacked and a green photo-sensing device and a blue photo-sensing device may be integrated in the semiconductor substrate 110.

Figure 10:
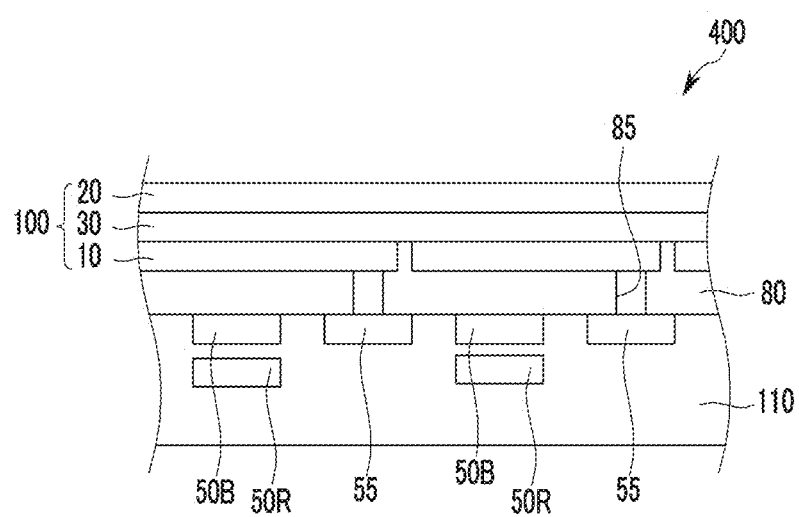
FIG. 10 is a cross-sectional view showing another example of the organic CMOS image sensor of FIG. 8.

FIG. 10 is a cross-sectional view showing another example of the organic CMOS image sensor of FIG. 8.

The organic CMOS image sensor 400 according to example embodiments includes a semiconductor substrate 110 integrated with photo-sensing devices 50B and 50R, a transmission transistor (not shown), and a charge storage 55, an upper insulation layer 80, and an organic photoelectronic device 100, like the example embodiment as illustrated in FIG. 10.

The organic CMOS image sensor 400 according to example embodiments includes the blue photo-sensing device 50B and the red photo-sensing device 50R stacked in a vertical direction and a color filter layer 70 is omitted. The blue photo-sensing device 50B and the red photo-sensing device 50R are electrically connected with the charge storage device (not shown) and may be transferred by the transmission transistor. The blue photo-sensing device 50B and the red photo-sensing device 50R may selectively absorb light in each wavelength region according to a stack depth.

As described above, the organic photoelectronic device configured to selectively absorb light in a green wavelength region has a stack structure and the red photo-sensing device and the blue photo-sensing device are stacked. Thus, the size of an image sensor may be reduced to realize a down-sized image sensor. In addition, as described above, a crosstalk due to unnecessary adsorption of light in other wavelength regions except green may be reduced and sensitivity may be increased by improving green wavelength selectivity in the light-absorption layer 30 of the organic photoelectronic device 100.

In FIG. 10, the organic photoelectronic device 100 of FIG. 1 is included, but example embodiments are not limited thereto, and thus the organic photoelectronic device 200 of FIG. 7 may be applied in the same manner.

In FIG. 10, a stack structure where an organic photoelectronic device configured to selectively absorb light in a green wavelength region is stacked is illustrated, but the present disclosure is not limited thereto. The present disclosure may have a structure where an organic photoelectronic device configured to selectively absorb light in a blue wavelength region is stacked and a green photo-sensing device and a red photo-sensing device may be integrated in the semiconductor substrate 110, or a structure where an organic photoelectronic device configured to selectively absorb light in a red wavelength region is stacked and a green photo-sensing device and a blue photo-sensing device may be integrated in the semiconductor substrate 110.

Figure 11:
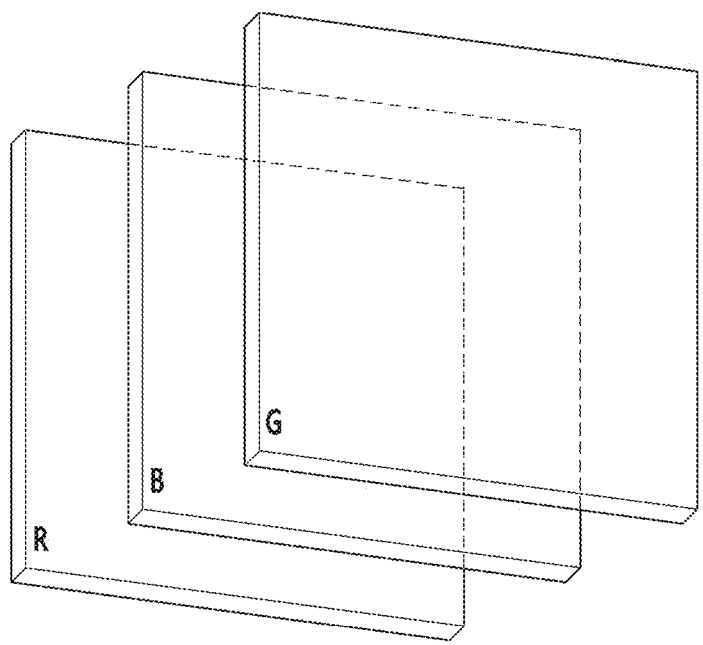
FIG. 11 is a schematic top plan view showing an organic CMOS image sensor according to example embodiments.
Figure 12:
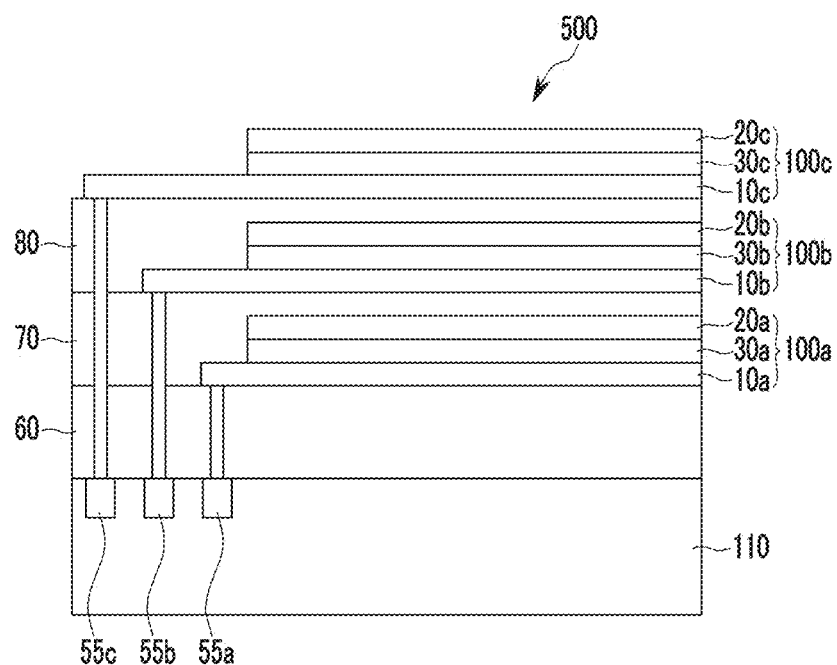
FIG. 12 is a cross-sectional view showing an organic CMOS image sensor of FIG. 11.

FIG. 11 is a schematic top plan view showing an organic CMOS image sensor according to example embodiments and FIG. 12 is a cross-sectional view of an organic CMOS image sensor of FIG. 11.

The organic CMOS image sensor 500 according to example embodiments includes a green photoelectronic device configured to selectively absorb light in a green wavelength region, a blue photoelectronic device configured to selectively absorb light in a blue wavelength region, and a red photoelectronic device configured to selectively absorb light in a green wavelength region, and they are stacked.

The organic CMOS image sensor 500 according to the example embodiments includes a semiconductor substrate 110, a lower insulation layer 60, an intermediate insulation layer 70, an upper insulation layer 80, a first organic photoelectronic device 100a, a second organic photoelectronic device 100b, and a third organic photoelectronic device 100c.

The semiconductor substrate 110 may be a silicon substrate, and is integrated with the transmission transistor (not shown) and the charge storage devices 55a, 55b, and 55c.

A metal wire (not shown) and a pad (not shown) are formed on the semiconductor substrate 110, and the lower insulation layer 60 is formed on the metal wire and the pad.

The first organic photoelectronic device 100a is formed on the lower insulation layer 60.

The first organic photoelectronic device 100a includes a first electrode 10a and a second electrode 20a facing each other and a light-absorption layer 30a between the first electrode 10a and the second electrode 20a. One of the first electrode 10a and the second electrode 20a may be an anode and the other may be a cathode. The light-absorption layer 30a may selectively absorb light in one of red, blue, and green wavelength regions. For example, the first organic photoelectronic device 100a may be a red photoelectronic device.

The second organic photoelectronic device 100b is formed on the intermediate insulation layer 70.

The second organic photoelectronic device 100b is formed on the intermediate insulation layer 70.

The second organic photoelectronic device 100b includes a first electrode 10b and a second electrode 20b facing each other and a light-absorption layer 30b between the first electrode 10b and the second electrode 20b. One of the first electrode 10b and the second electrode 20b may be an anode and the other may be a cathode. The light-absorption layer 30b may selectively absorb light in one of red, blue, and green wavelength regions. For example, the second organic photoelectronic device 100b may be a blue photoelectronic device.

The upper insulation layer 80 is formed on the second organic photoelectronic device 100b. The lower insulation layer 60, the intermediate insulation layer 70, and the upper insulation layer 80 have a plurality of through-holes exposing the charge storages 55a, 55b, and 55c.

The third organic photoelectronic device 100c is formed on the upper insulation layer 80. The third organic photoelectronic device 100c includes a first electrode 10c and a second electrode 20c and the light-absorption layer 30c between the first electrode 10c and the second electrode 20c. One of the first electrode 10c and the second electrode 20c may be an anode and the other may be a cathode. The light-absorption layer 30c may selectively absorb light in one of red, blue, and green wavelength regions. For example, the third organic photoelectronic device 100c may be a green photoelectronic device.

At least one of the light-absorption layer 30a of the first organic photoelectronic device 100a, the light-absorption layer 30b of the second organic photoelectronic device 100b, and the light-absorption layer 30c of the third organic photoelectronic device 100c may include the p-type semiconductor and the n-type semiconductor in a different composition ratio depending on a region where light in each wavelength region is mainly absorbed as described above, and a plurality of regions having a different composition ratio between the p-type and n-type semiconductors may be included along the thickness direction of the light-absorption layers 30a, 30b, and 30c. Specific illustration is the same as described above.

The drawing shows a structure in which the first organic photoelectronic device 100a, the second organic photoelectronic device 100b, and the third organic photoelectronic device 100c are sequentially stacked, but the present disclosure is not limited thereto, and they may be stacked in various orders.

As described above, the first organic photoelectronic device 100a, the second organic photoelectronic device 100b, and the third organic photoelectronic device 100c have a stack structure, and thus the size of an image sensor may be reduced to realize a down-sized image sensor. In addition, as described above, a crosstalk due to unnecessary adsorption of light in other wavelength regions except green may be reduced and sensitivity may be increased by improving green wavelength selectivity in the light-absorption layer 30 of the organic photoelectronic device 100.

The image sensor may be applied to, for example, various electronic devices (e.g., a mobile phone or a digital camera), but is not limited thereto.

Hereinafter, the present disclosure is illustrated in more detail with reference to examples. However, these are examples, and the present disclosure is not limited thereto.
Manufacture of Organic Photoelectronic Device Example 1

An about 150 nm-thick anode is formed by sputtering ITO on a glass substrate, and a 130 nm-thick light-absorption layer is formed thereon by codepositing 2-((5-(naphthalen-1-yl(phenyl)amino)selenophen-2-yl)methylene)-1H-cyclopenta[b]naphthalene-1,3(2H)-dione as a p-type semiconductor and C60 as an n-type semiconductor. Herein, the light-absorption layer is formed by changing the volume ratio of the p-type semiconductor and the n-type semiconductor to sequentially form a 60 nm-thick lower layer including the p-type semiconductor and the n-type semiconductor in a volume ratio of 1.25:1, a 40 nm-thick middle layer including the p-type semiconductor and the n-type semiconductor in a volume ratio of 1.6:1, and a 30 nm-thick upper layer including the p-type semiconductor and the n-type semiconductor in a volume ratio of 1.25:1. Subsequently, a molybdenum oxide (MoOx, 0<x≤3) thin film is deposited to be 10 nm thick on the light-absorption layer. Then, a 7 nm thick cathode is formed on the molybdenum oxide thin film by sputtering ITO, and a 40 nm-thick high refractive layer is formed by depositing aluminum oxide, manufacturing an organic photoelectronic device.

Figure 19:
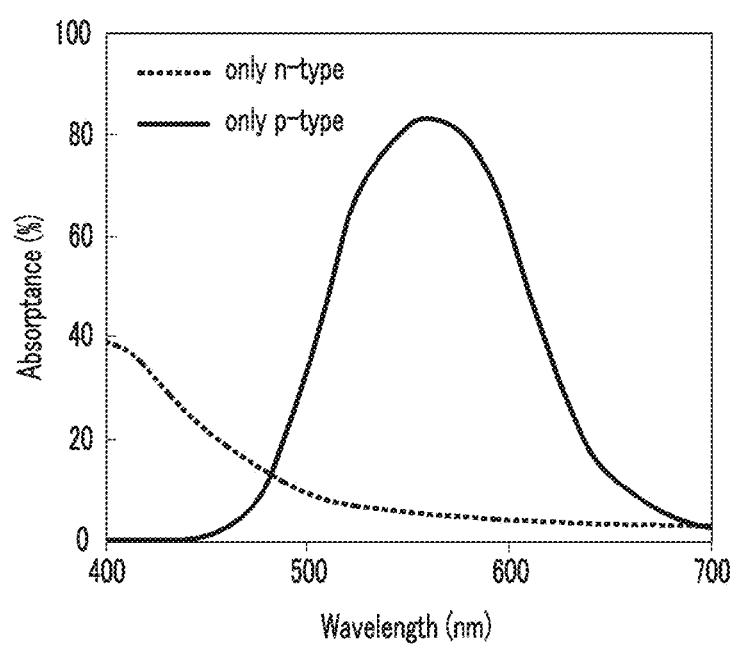
FIG. 19 shows light absorption curves of the p-type semiconductor and the n-type semiconductor depending on a wavelength in the organic photoelectronic devices according to Examples 1 to 3 and Comparative Examples 1 to 5.

FIG. 19 shows light absorption curves of the p-type semiconductor, 2-((5-(naphthalen-1-yl(phenyl)amino)selenophen-2-yl)methylene)-1H-cyclopenta[b]naphthalene-1,3(2H)-dione and the n-type semiconductor, C60 depending on a wavelength.

Referring to FIG. 19, the p-type semiconductor, 2-((5-(naphthalen-1-yl(phenyl)amino)selenophen-2-yl)methylene)-1H-cyclopenta[b]naphthalene-1,3(2H)-dione is a light-absorbing material selectively absorbing light in a wavelength region of about 500 to 600 nm, that is, light in a green wavelength region, and the n-type semiconductor, C60 is a light-absorbing material absorbing light in a wavelength region of about 400 to 600 nm, that is, light in a blue wavelength region and a green wavelength region.

Example 2

An organic photoelectronic device is manufactured according to the same method as Example 1 except for forming an absorption layer including a 60 nm-thick lower layer including the p-type semiconductor and the n-type semiconductor in a volume ratio of 1.3:1, a 40 nm-thick middle layer including the p-type semiconductor and the n-type semiconductor in a volume ratio of 1.6:1, and a 30 nm-thick upper layer including the p-type semiconductor and the n-type semiconductor in a volume ratio of 1.3:1.

Example 3

An organic photoelectronic device is manufactured according to the same method as Example 1 except for forming an absorption layer including a 60 nm-thick lower layer including the p-type semiconductor and the n-type semiconductor in a volume ratio of 1.3:1, a 40 nm-thick middle layer including the p-type semiconductor and the n-type semiconductor in a volume ratio of 1.9:1, and a 30 nm-thick upper layer including the p-type semiconductor and the n-type semiconductor in a volume ratio of 1.3:1.

Comparative Example 1

An organic photoelectronic device is manufactured according to the same method as Example 1 except for forming a 130 nm-thick light-absorption layer by codepositing the p-type semiconductor and the n-type semiconductor in a single volume ratio of 1.25:1.

Comparative Example 2

An organic photoelectronic device is manufactured according to the same method as Example 1 except for forming a 130 nm-thick light-absorption layer by codepositing the p-type semiconductor and the n-type semiconductor in a single volume ratio of 1:1.

Comparative Example 3

An organic photoelectronic device is manufactured according to the same method as Example 1 except for forming an absorption layer including a 60 nm-thick lower layer including the p-type semiconductor and the n-type semiconductor in a volume ratio of 1:3, a 40 nm-thick middle layer including the p-type semiconductor and the n-type semiconductor in a volume ratio of 1:1, and a 30 nm-thick upper layer including the p-type semiconductor and the n-type semiconductor in a volume ratio of 3:1.

Comparative Example 4

An organic photoelectronic device is manufactured according to the same method as Example 1 except for forming a 130 nm-thick light-absorption layer by codepositing the p-type semiconductor and the n-type semiconductor in a single volume ratio of 1.3:1.

Comparative Example 5

An organic photoelectronic device is manufactured according to the same method as Example 1 except for forming a 130 nm-thick light-absorption layer by codepositing the p-type semiconductor and the n-type semiconductor in a single volume ratio of 1.39:1.

Comparative Example 6

An organic photoelectronic device is manufactured according to the same method as Example 1 except for forming a 130 nm-thick light-absorption layer by codepositing the p-type semiconductor and the n-type semiconductor in a single volume ratio of 1.48:1.

EVALUATION

Evaluation 1

External quantum efficiencies of the organic photoelectronic devices according to Example 1 and Comparative Example 1 depending on a wavelength region are compared.

Figure 13:
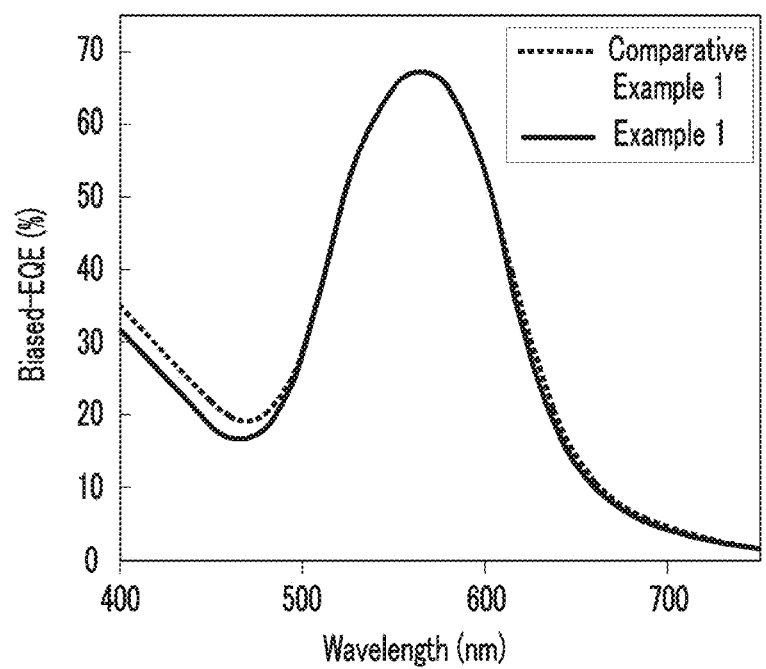
FIG. 13 is a graph showing external quantum efficiency depending on a wavelength of the organic photoelectronic devices according to Example 1 and Comparative Example 1.

FIG. 13 is a graph showing the external quantum efficiencies of the organic photoelectronic devices according to Example 1 and Comparative Example 1 depending on a wavelength.

Referring to FIG. 13, the organic photoelectronic device according to Example 1 may secure external quantum efficiency (EQE) in a wavelength region of about 500 nm to 600 nm, that is, in a green wavelength region but reduced external quantum efficiency (EQE) in a wavelength region of about 400 nm to 500 nm, that is, in a blue wavelength region compared with the organic photoelectronic device according to Comparative Example 1. Accordingly, wavelength selectivity of the organic photoelectronic device according to Example 1 about the green wavelength region may be increased compared with the organic photoelectronic device according to Comparative Example 1.

Evaluation 2

External quantum efficiency changes of the organic photoelectronic devices according to Example 1 and Comparative Exampled 1 to 3 in the green wavelength region and the blue wavelength region are compared.

Figure 14:
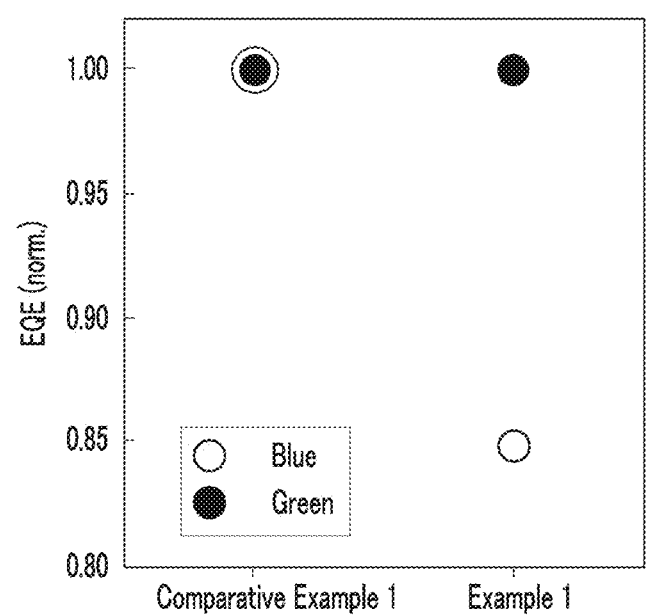
FIG. 14 is a graph showing external quantum efficiency in a green wavelength region and a blue wavelength region of the organic photoelectronic devices according to Example 1 and Comparative Example 1.
Figure 15:
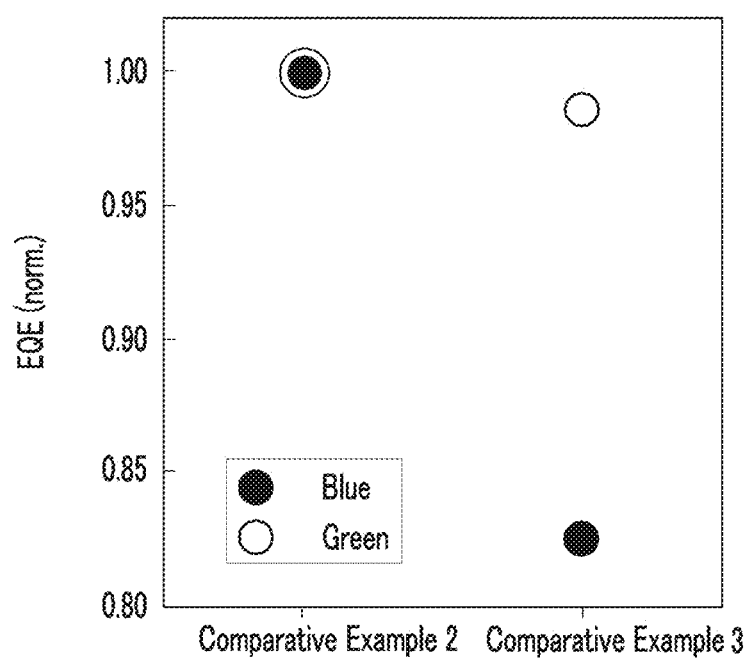
FIG. 15 is a graph showing external quantum efficiency in a green wavelength region and a blue wavelength region of the organic photoelectronic devices according to Comparative Examples 2 and 3.

FIG. 14 is a graph showing external quantum efficiency in a green wavelength region and a blue wavelength region of the organic photoelectronic devices according to Example 1 and Comparative Example 1 and FIG. 15 is a graph showing external quantum efficiency in a green wavelength region and a blue wavelength region of the organic photoelectronic devices according to Comparative Examples 2 and 3.

Referring to FIG. 14, the organic photoelectronic device according to Example 1 shows equivalent external quantum efficiency (EQE) in the green wavelength region but largely reduced external quantum efficiency (EQE) in the blue wavelength region compared with the organic photoelectronic device according to Comparative Example 1. Accordingly, the wavelength selectivity of the organic photoelectronic device according to Example 1 about the green wavelength region may be increased by lowering the external quantum efficiency of the organic photoelectronic device about the blue wavelength region.

Referring to FIG. 15, the organic photoelectronic device according to Comparative Example 2 shows substantially the same external quantum efficiency (EQE) in the green wavelength region as the external quantum efficiency (EQE) in the blue wavelength region, and the organic photoelectronic device according to Comparative Example 3 shows much reduced external quantum efficiency (EQE) in the green wavelength region compared with the organic photoelectronic device according to Comparative Example 2. Accordingly, the organic photoelectronic devices according to Comparative Examples 2 and 3 show low wavelength selectivity about the green wavelength region, and in particular, the organic photoelectronic device according to Comparative Example 3 shows much reduced external quantum efficiency (EQE) about the green wavelength region.

Accordingly, wavelength selectivity of the organic photoelectronic device according to Example 1 may be increased by decreasing external quantum efficiency of the blue wavelength region (EQE) as well as securing external quantum efficiency (EQE) of the green wavelength region.

Evaluation 3

Optical simulations of the organic photoelectronic devices according to Example 2 and Comparative Example 4 are evaluated. The optical simulations are evaluated by using an MATLAB software.

$$EQE(\lambda) = Abs(\lambda) \times CS(ratio) \times CC(ratio) \quad \text{[Equation 1]}$$

Figure 16:
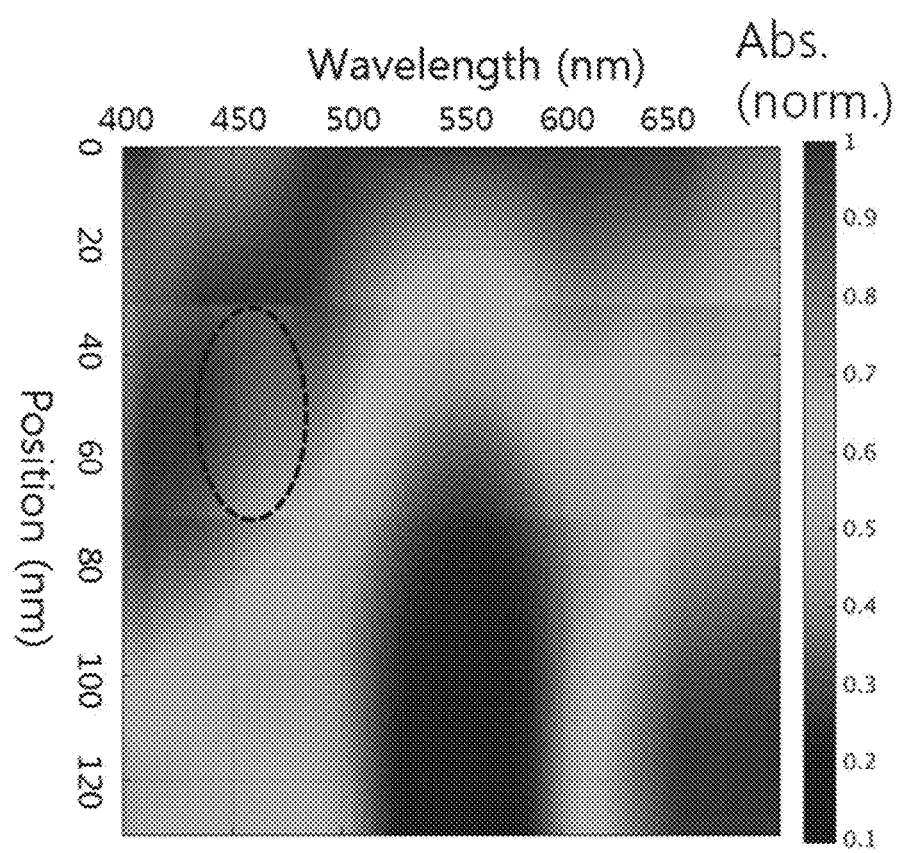
FIG. 16 is a simulation result of an absorption wavelength region depending on a position of light-absorption layer of the organic photoelectronic device according to Example 2.
Figure 17:
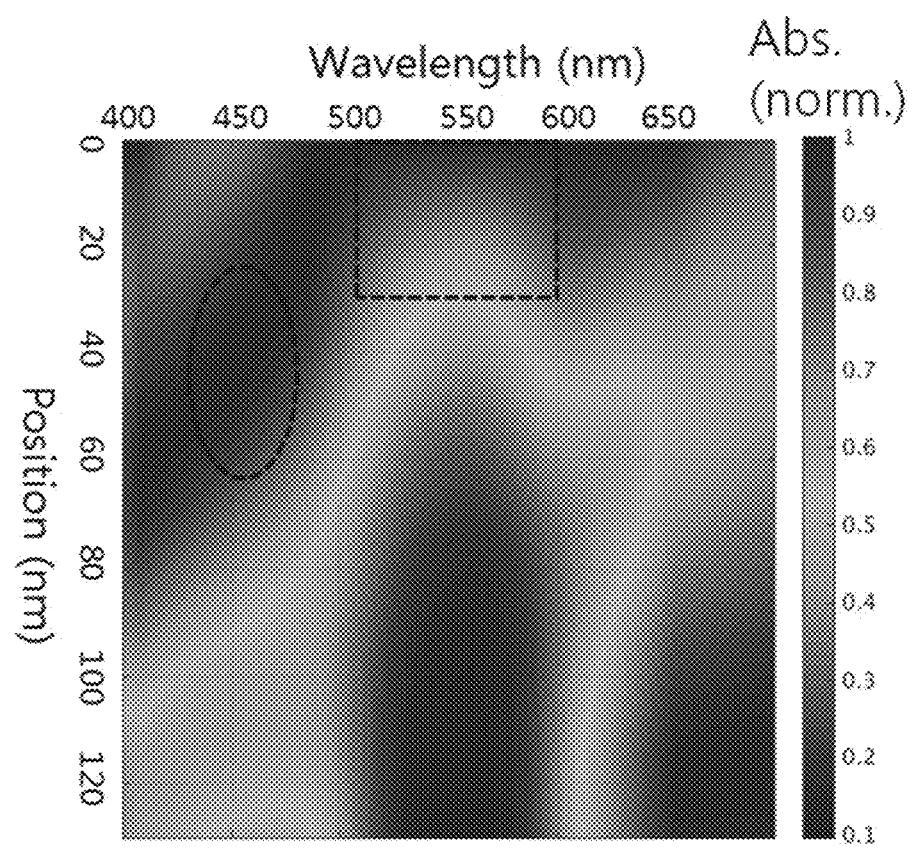
FIG. 17 is a simulation result of an absorption wavelength region depending on a position of light-absorption layer of the organic photoelectronic device according to Comparative Example 4.

The results are provided in FIGS. 16 and 17.

FIG. 16 is a simulation result of an absorption wavelength region depending on a position of light-absorption layer of the organic photoelectronic device according to Example 2 and FIG. 17 is a simulation result of an absorption wavelength region depending on a position of light-absorption layer of the organic photoelectronic device according to Comparative Example 4.

Referring to FIGS. 16 and 17, the organic photoelectronic device according to Example 2 turns out to less absorb light in the blue wavelength region compared with the organic photoelectronic device according to Comparative Example 4.

Evaluation 4

External quantum efficiency (EQE) decrease degrees of the organic photoelectronic devices according to Examples 2 and 3 and Comparative Examples 4 to 6 about the blue wavelength region at the maximum external quantum efficiency (Max EQE) of the green wavelength region is predicted through a simulation.

The simulation is evaluated by using an MATLAB software.

$$EQE(\lambda) = \sum_{n=1,2,3} (\text{Abs}_n(\lambda) \times IQE_n) \quad \text{[Equation 2]}$$

The results are provided in Table 1.

TABLE 1

|  | External quantum efficiency (EQE) of blue wavelength region @ Max green EQE |
|---|---|
| Example 2 | 19.9 |
| Example 3 | 19.1 |
| Comparative Example 4 | 21.1 |
| Comparative Example 5 | 20.5 |
| Comparative Example 6 | 20.0 |

Referring to Table 1, the organic photoelectronic devices according to Examples 2 and 3 exhibit lower external quantum efficiency about the blue wavelength region at the maximum external quantum efficiency of the green wavelength region compared with the organic photoelectronic devices according to Comparative Examples 4 to 6.

Evaluation 5

An image sensor is designed by respectively using the organic photoelectronic devices according to Example 1 and Comparative Example 1, and color difference and YSNR10 of the image sensor are evaluated. The image sensor is designed to have a structure shown in FIG. 9.

The color difference of the image sensor is evaluated in the following method. A RGB raw signal obtained from the image sensor is image-processed to reduce a difference from a real color. The image processing consists of a white balance process of unifying intensity of the RGB raw signal and a color correction process of reducing a color difference between an actual color of Macbeth chart (24 colors) and an original color obtained from the image sensor. The color correction process expresses a color by converting the RGB raw signal measured from the image sensor through a color correction matrix (CCM), and color characteristics of the image sensor may be evaluated by digitalizing a color difference of the converted color from the actual color of the Macbeth chart. The color difference indicates a difference from an actual color in the Macbeth chart, and as the color difference is smaller, a color may be closer to the actual color.

YSNR10 indicates luminance (unit: lux) that a signal and a noise have a ratio of 10, and herein, the signal is sensitivity of a green signal after the color correction process through the color correction matrix, and the noise is generated when the signal is measured in the image sensor. As the YSNR10 is smaller, image characteristics are satisfactory at low luminance.

Figure 18:
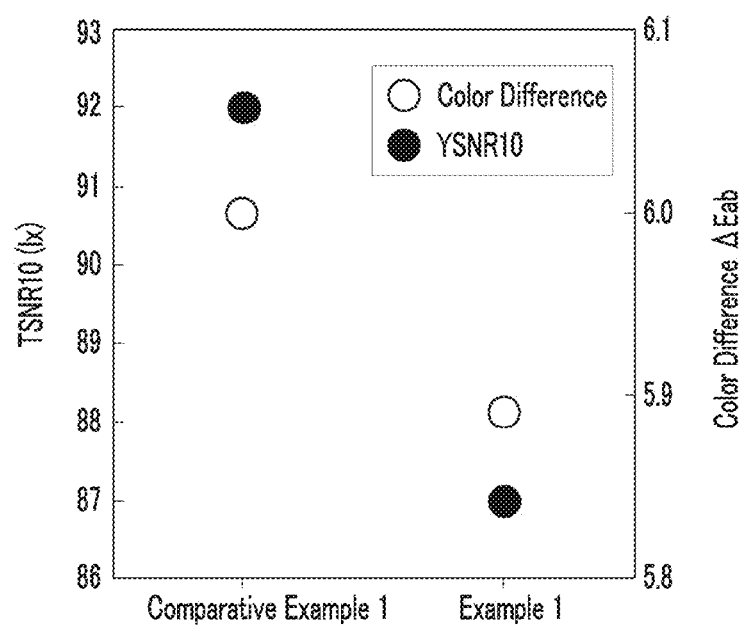
FIG. 18 is a graph showing color shifts and YSNR10 of image sensors to which the organic photoelectronic devices according to Example 1 and Comparative Example 1 are applied.

The results are provided in FIG. 18.

FIG. 18 is graph showing color differences and YSNR10 of image sensors to which the organic photoelectronic devices according to Example 1 and Comparative Example 1 are applied Referring to FIG. 18, an image sensor manufactured by applying the organic photoelectronic device according to Example 1 exhibits a small color difference and YSNR10 compared with an image sensor manufactured by applying the organic photoelectronic device according to Comparative Example 1. Accordingly, the image sensor manufactured by applying the organic photoelectronic device according to Example 1 exhibits improved wavelength selectivity and thus improved color display characteristics compared with an image sensor manufactured by applying the organic photoelectronic device according to Comparative Example 1.

Evaluation 6

Each image sensor is designed by respectively applying the organic photoelectronic devices according to Example 1 and Comparative Example 1, and its crosstalk is evaluated.

The image sensor is designed to have a structure shown in FIG. 9.

The crosstalk evaluation is performed as follows.

n and k of the absorption layers in the organic photoelectronic devices according to Example 1 and Comparative Example 1 are obtained by using Spectroscopic Ellipsometry. The n and k and the photoelectric conversion efficiency of a silicon photodiode and the organic photoelectronic device are used to obtain spectrum sensitivity of red photodiode, green photoelectronic device, and blue photodiode having the structure shown in FIG. 9 as FDTD (Finite Difference Time Domain). Herein, a wavelength region is divided into three regions of 440-480 nm (blue), 520-560 nm (green), and 590-630 nm (red), and then, how much other light conversion devices in each color region are optically interfered is evaluated. In other words, a relative integral of the sensitivity curved lines of the red and green light conversion devices in the 440-480 nm region based on 100 of an integral of the sensitivity curved line of the blue light conversion device in the 440-480 nm region. This relative integral is a crosstalk of the red and green light conversion devices about a blue region in the 440-480 nm. Each of the crosstalks in the 520-560 nm and the 590-630 nm is obtained in the same as above. Last, the 6 measurements are averaged to obtain an average crosstalk.

The results are provided in Table 2.

TABLE 2

|  | Average crosstalk (%) |
|---|---|
| Example 1 | 25.1 |
| Comparative Example 1 | 26.8 |

Referring to Table 2, an image sensor manufactured by applying the organic photoelectronic device according to Example 1 exhibits a reduced average crosstalk and specifically, about 7% reduced average crosstalk compared with an image sensor manufactured by applying the organic photoelectronic device according to Comparative Example 1.

While this disclosure has been described in connection with what is presently considered to be practical example embodiments, it is to be understood that the inventive concepts are not limited to the disclosed embodiments, but, on the contrary, are intended to cover various modifications and equivalent arrangements included within the spirit and scope of the appended claims.

What is claimed is:
1. An organic photoelectronic device, comprising:
a first electrode and a second electrode facing each other; and
a light-absorption layer between the first electrode and the second electrode, the light-absorption layer including, a first region closest to the first electrode, the first region having a first composition ratio ($p_1/n_1$) of a p-type semiconductor relative to an n-type semiconductor, a second region closest to the second electrode, the second region having a second composition ratio ($p_2/n_2$) of the p-type semiconductor relative to the n-type semiconductor, and a third region between the first region and the second region in a thickness direction, the third region having a third composition ratio ($p_3/n_3$) of the p-type semiconductor relative to the n-type semiconductor, wherein the third composition ratio ($p_3/n_3$) is greater than the first composition ratio ($p_1/n_1$) and the second composition ratio ($p_2/n_2$), an amount of the p-type semiconductor in the third region is greater than an amount of the p-type semiconductor in the first region and an amount of the p-type semiconductor in the second region, respectively.

2. The organic photoelectronic device of claim 1, wherein the first composition ratio ($p_1/n_1$) is the same as the second composition ratio ($p_2/n_2$).

3. The organic photoelectronic device of claim 1, wherein a composition ratio (p/n) of the p-type semiconductor relative to the n-type semiconductor of the light-absorption layer is discontinuously increased and then decreased along the thickness direction.

4. The organic photoelectronic device of claim 1, wherein the third composition ratio ($p_3/n_3$) is about 5% to 80% greater than the first composition ratio ($p_1/n_1$) and the second composition ratio ($p_2/n_2$).

5. The organic photoelectronic device of claim 1, wherein one of the p-type semiconductor and the n-type semiconductor is a light-absorbing material configured to selectively absorb a first visible light selected from light in blue wavelength region, light in green wavelength region, and light in red wavelength region, and the other of the p-type semiconductor and the n-type semiconductor is a light-absorbing material configured to absorb the first visible light and a second visible light, the second visible light being different from the first visible light and selected from light in blue wavelength region, light in green wavelength region, and light in red wavelength region.

6. The organic photoelectronic device of claim 5, wherein the first visible light is light in green wavelength region, and the second visible light is light in blue wavelength region.

7. The organic photoelectronic device of claim 5, wherein the p-type semiconductor is the light-absorbing material configured to selectively absorb the first visible light; and the n-type semiconductor is the light-absorbing material configured to absorb the first visible light and the second visible light.

8. An image sensor comprising the organic photoelectronic device of claim 1.

9. The image sensor of claim 8, wherein
the light-absorption layer is configured to absorb light in at least one part of a visible ray wavelength region;
the visible ray wavelength region includes first visible light, second visible light, and third visible light, each of the first visible light, the second visible light and the third visible light are different wavelength regions,
the organic photoelectronic device is configured to selectively absorb the first visible light; and
the image sensor further comprises a semiconductor substrate integrated with a plurality of first photo-sensing devices configured to sense the second visible light and a plurality of second photo-sensing devices configured to sense the third visible light.

10. The organic photoelectronic device of claim 9, wherein the first visible light is light in green wavelength region, the second visible light is light in blue wavelength region, and the third visible light is light in red wavelength region.

11. The image sensor of claim 9, wherein the plurality of first photo-sensing devices and the plurality of second photo-sensing devices are spaced apart from each other in a horizontal direction.

12. The image sensor of claim 11, further comprising:
a first color filter overlapping the plurality of first photo-sensing devices, the first color filter configured to selectively transmit the second visible light; and
a second color filter overlapping the plurality of second photo-sensing devices, the second color filter configured to selectively transmit the third visible light.

13. The image sensor of claim 9, wherein the plurality of first photo-sensing devices and the plurality of second photo-sensing devices are spaced apart from each other in a vertical direction.

14. The image sensor of claim 9, wherein
the light-absorption layer is configured to absorb light in at least one part of a visible ray wavelength region;
the visible ray wavelength region includes first visible light, second visible light, and third visible light, each of the first visible light, the second visible light and the third visible light are different wavelength regions;
the organic photoelectronic device is a first organic photoelectronic device configured to selectively absorb the first visible light;
the image sensor further comprises a second organic photoelectronic device configured to selectively absorb the second visible light and a third organic photoelectronic device configured to selectively absorb the third visible light; and
the first organic photoelectronic device, the second organic photoelectronic device, and the third organic photoelectronic device are sequentially stacked.

15. An electronic device comprising the image sensor of claim 8.

16. An organic photoelectronic device, comprising:
a first electrode and a second electrode facing each other; and
a light-absorption layer between the first electrode and the second electrode, the light-absorption layer including,
a first region closest to the first electrode, the first region having a first composition ratio ($p_1/n_1$) of a p-type semiconductor relative to an n-type semiconductor,
a second region closest to the second electrode, the second region having a second composition ratio ($p_2/n_2$) of the p-type semiconductor relative to the n-type semiconductor, and
a third region between the first region and the second region in a thickness direction, the third region having a third composition ratio ($p_3/n_3$) of the p-type semiconductor relative to the n-type semiconductor,
wherein the first composition ratio ($p_1/n_1$) is the same as the second composition ratio ($p_2/n_2$), and
the third composition ratio ($p_3/n_3$) is greater than the first composition ratio ($p_1/n_1$) and the second composition ratio ($p_2/n_2$).

17. The organic photoelectronic device of claim 16, wherein an amount of the p-type semiconductor in the third region is greater than an amount of the p-type semiconductor in the first region and an amount of the p-type semiconductor in the second region, respectively.

18. The organic photoelectronic device of claim 16, wherein an amount of the n-type semiconductor in the third region is lesser than an amount of the n-type semiconductor in the first region and an amount of the n-type semiconductor in the second region, respectively.

19. An image sensor comprising the organic photoelectronic device of claim 16.

20. An electronic device comprising the image sensor of claim 19.

* * * * *